US007750630B2

(12) United States Patent
Van Helvoort et al.

(10) Patent No.: US 7,750,630 B2
(45) Date of Patent: Jul. 6, 2010

(54) MAGNETIC RESONANCE DEVICE AND METHOD FOR ENERGIZING RECEIVING UNITS

(75) Inventors: Marinus Johannes Adrianus Maria Van Helvoort, Eindhoven (NL); Johannes Petrus Groen, Eindhoven (NL); Robert Paul Kleihorst, Eindhoven (NL); Cornelis Leonardus Gerardus Ham, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 373 days.

(21) Appl. No.: 11/721,173

(22) PCT Filed: Dec. 14, 2005

(86) PCT No.: PCT/IB2005/054230

§ 371 (c)(1),
(2), (4) Date: Jun. 8, 2007

(87) PCT Pub. No.: WO2006/067682

PCT Pub. Date: Jun. 29, 2006

(65) Prior Publication Data

US 2009/0237079 A1      Sep. 24, 2009

(30) Foreign Application Priority Data

Dec. 21, 2004   (EP)   .................. 04106764

(51) Int. Cl.
*G01V 3/00* (2006.01)
(52) U.S. Cl. ...................................... 324/307
(58) Field of Classification Search .......... 324/300–322
See application file for complete search history.

(56) References Cited

U.S. PATENT DOCUMENTS

| 4,740,744 | A | 4/1988 | Lubarsky et al. |
| 5,245,288 | A | 9/1993 | Leussler |
| 5,384,536 | A | 1/1995 | Murakami et al. |
| 5,529,068 | A | 6/1996 | Hoenninger, III et al. |
| 6,297,637 | B1* | 10/2001 | Feld et al. ................. 324/322 |
| 6,474,341 | B1 | 11/2002 | Hunter et al. |
| 6,621,413 | B1* | 9/2003 | Roman et al. .......... 340/539.12 |
| 7,323,876 | B2* | 1/2008 | Den Boef ................. 324/322 |
| 2003/0060808 | A1* | 3/2003 | Wilk ............................. 606/1 |
| 2003/0069051 | A1 | 4/2003 | Pretre et al. |
| 2003/0206019 | A1 | 11/2003 | Boskamp |
| 2005/0027197 | A1* | 2/2005 | Segawa et al. ............ 600/463 |

* cited by examiner

*Primary Examiner*—Brij B Shrivastav
*Assistant Examiner*—Dixomara Vargas

(57) ABSTRACT

The invention relates to a device (1) for magnetic resonance imaging of a body (7), comprising a main magnet (2) for generation of a stationary and substantially homogeneous main magnetic field within the examination zone, a plurality of wireless receiving units (10a, 10b) placed in or near the examination zone, and sampling means (21a, 21b) operating at a variable sampling frequency for sampling the received MR signals and for converting them into digital signal samples. The invention proposes to make provision for energizing means (17) generating an RF energizing field within the examination zone for inductively supplying electric power to the wireless receiving units (10a, 10b), wherein the frequency of the RF energizing field is an integer multiple of the sampling frequency.

10 Claims, 2 Drawing Sheets

MAGNETIC RESONANCE DEVICE AND METHOD FOR ENERGIZING RECEIVING UNITS

Figure 1:
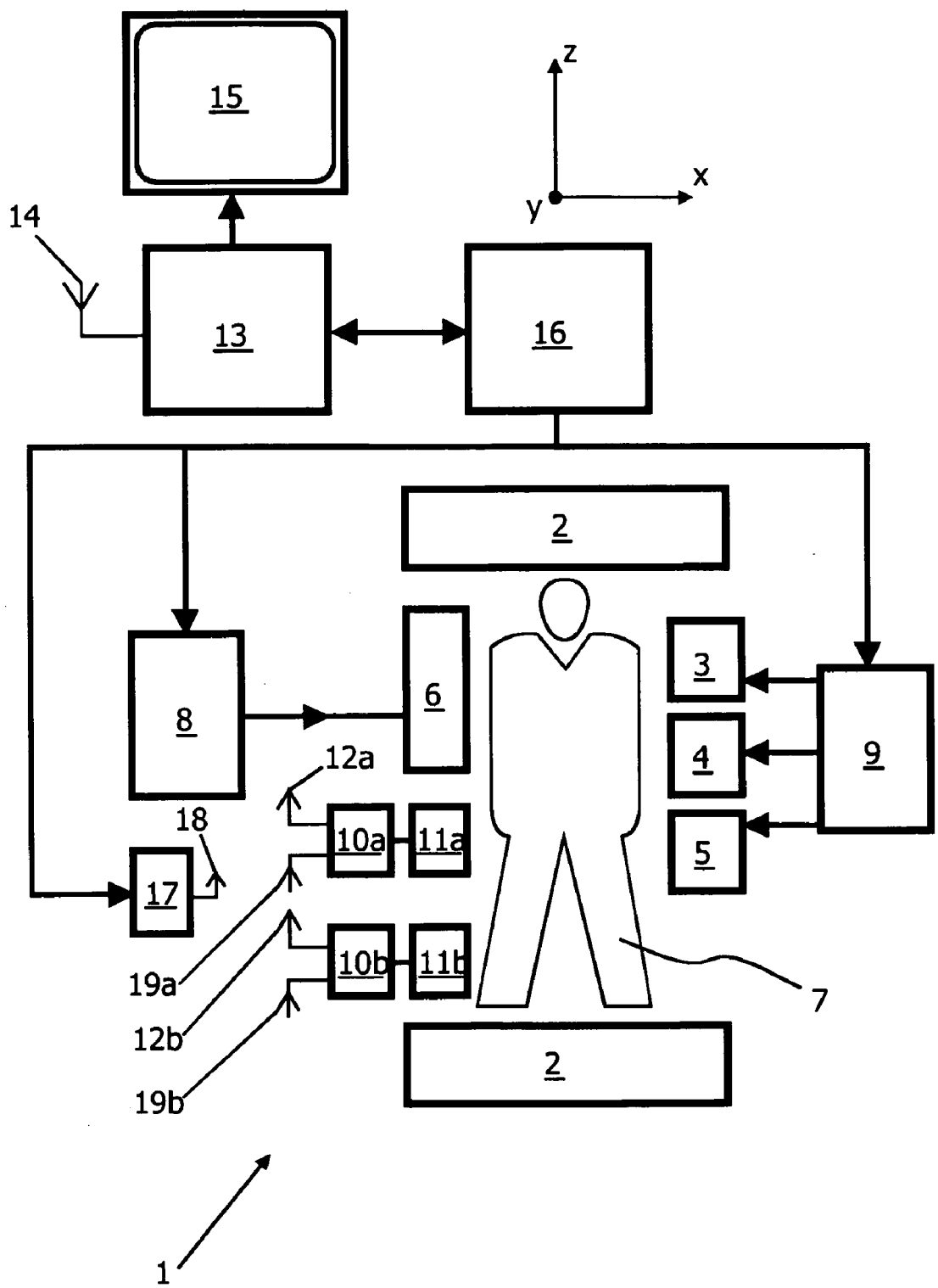

The invention relates to a device for magnetic resonance (MR) imaging.

Furthermore, the invention relates to a method for MR imaging and to a computer program for an MR imaging device.

In MR imaging, pulse sequences consisting of switched RF fields ($B_1$) and magnetic field gradient pulses are applied to an object (usually the body of a patient) placed in a stationary and substantially homogeneous main magnetic field ($B_0$) to generate phase encoded magnetic resonance signals, which are then scanned in order to obtain information from the object and to reconstruct images thereof. Since its initial development, the number of clinical relevant fields of application of MRI has grown enormously. MRI can be applied to almost every part of the body, and it can be used to obtain information about a number of important functions of the human body. The pulse sequence, which is applied during an MR scan, determines completely the characteristics of the reconstructed images, such as location and orientation in the object, dimensions, resolution, signal-to-noise ratio, contrast, sensitivity for movements, etcetera. An operator of an MRI device has to choose the appropriate sequence and has to adjust and optimize its parameters for the respective application.

Usually, MR imaging devices comprise a superconducting main magnet, for the generation of the static field $B_0$ in the examination zone, gradient coils, for the generation of switched magnetic field gradients during the imaging sequence, and an RF coil assembly. The RF coil assembly of known MR systems includes a transmit coil to generate the above-mentioned $B_1$-field for excitation of nuclear spins, and one or more receive antennas used in conjunction with the transmit coil to detect and receive the MR signals from the examined object. The receive antennas are typically connected to a receive chain of the MR apparatus. This receive chain comprises RF amplifiers, attenuators, modulators, filters and digitizers in order to allow for a narrow-band, low-noise detection of the MR signals and for converting the detected MR signals into digital signal samples. These signals are finally processed by means of a computer and converted into digital images of the object.

In known parallel MRI techniques, multiple receiving antennas with different spatial sensitivity profiles are employed, for example to enhance local sensitivity or to reduce the scan time for a diagnostic image. The latter can be achieved, for example, in accordance with the known SENSE technique by acquiring a smaller set of phase encoded magnetic resonance signals than would actually be necessary to completely cover the predetermined field of view in accordance with Nyquist's theorem.

The above-described SENSE technique as well as other known parallel MR imaging techniques have proven to be very efficient for practical applications. Therefore, modern MR systems increasingly demand massive parallel imaging. This necessarily requires the use of a high number of MR receiving antennas (coils) located in the examination zone of the MR device, each antenna being associated with a separate receiving channel. For connecting the individual receiving antennas to the back end electronics (the receive chain) of the MR device, which is usually located outside the actual examination room, many cables are required. This cabling is expensive and also bulky, which is a major concern when considering the limited space within the examination volume of common MR devices. Particularly in the case of receiving antennas integrated in a moving patient support, the necessary cabling is a technical challenge and therefore cost-intensive. The more antennas are used in MR imaging, the more complex the cable handling around the body of the examined patient becomes. Usually, so-called combiner boxes located near the examination zone are used, in which the cables from the individual receiving coils are bundled. From the combiner boxes multifunctional cables lead to the back end electronics of the MR device. Naturally, these multifunctional cables and also the corresponding combiner boxes comprise a plurality of metallic parts and wires. It is a known problem that these metallic parts and wires tend to disturb the radio frequency field in the examination zone and can cause a high local specific absorption rate (SAR) in the tissue of the examined body in the vicinity of the respective metallic parts and wires. This is a major issue with regard to safety of operation of the MR device. For example, a patient may experience local burns of the skin in areas close to wires connecting the receiving antennas to the central processing unit of the MR device.

It is known for example from US 2003/0206019 A1 that cabling between MR receiving antennas and the remote signal processing electronics of an MR device can be dispensed with by using wireless transmission of the received MR signals from receiving units located in the vicinity of the examination zone to the central processing unit of the MR device. For establishing the wireless telemetry between the receiving antennas and the back end electronics of the MR device, the receiving units of the known system incorporate appropriate transmitters, which transmit modulated signals to a remote receiver associated with the central signal processing electronics of the MR device. The receiving units of the known system further comprise rechargeable batteries to provide electric power to the transmitters and the associated components. No cable connections at all—not even for the power supply—are thus required between the receiving units and the back end electronics of the known MR device. In order to keep the batteries of the receiving units charged, the RF pulses generated by the transmit coils of the known MR system are picked up and rectified to provide the necessary power.

The main drawback associated with the power supply of the wireless receiving units of the known system is that the tapping of the RF transmit field ($B_1$) for energizing the receiving units inevitably results in inhomogeneities of the excitation RF field. The RF field is disturbed in the examination zone and, as a consequence, very undesirable image artifacts occur. This problem can not simply be circumvented by providing additional RF power for inductive feeding of the receiving units, because this would likewise affect the excitation of the nuclear spins in an unpredictable and disturbing manner. Safety issues have also to be considered. Therefore it may not be acceptable to increase the strength of the RF field such that it always suffices for both the power supply of the receiving units and for the desired excitation of the nuclear magnetization. A further problem with the known technique is that the inductive feeding can only take place during time intervals when no signal acquisition is in progress. The energizing RF field used with the known system would otherwise interfere with the sensitive receiving electronics, particularly with the sampling means of the receiving chain. This would again have a very adverse distorting effect on image quality. As a consequence, the known system requires comparatively bulky batteries for energy storage in order to ensure sufficient power supply during the MR signal acquisition periods, when the inductive feeding has to be kept switched off.

Therefore it is readily appreciated that there is a need for an improved device for MR imaging which allows for massive parallel imaging using wirelessly operating receiving units. It is consequently the primary object of the present invention to provide an MR device which is arranged to inductively energize the wireless receiving units without interference with the nuclear spin system of the examined object. A further object of the invention is to provide an MR imaging device, which does not necessarily require bulky energy storage means (as e.g. rechargeable batteries) for the operation of the wireless receiving units.

In accordance with the present invention, an MR device for magnetic resonance imaging of a body placed in an examination zone is provided. The device comprises a main magnet for generation of a stationary and substantially homogeneous main magnetic field within the examination zone. Provision is made for a plurality of receiving units placed in or near the examination zone, which receiving units each comprise a receiving antenna for receiving MR signals from the body. The individual receiving units have transmitters for wirelessly transmitting the received MR signals to a central processing unit. The device of the invention further comprises sampling means operating at a variable sampling frequency for sampling the received MR signals and for converting them into digital signal samples. An essential feature of the invention is that provision is made for energizing means generating an RF energizing field within the examination zone for inductively supplying electric power to the wireless receiving units. The frequency of this RF energizing field is selected such that it equals an integer multiple of the sampling frequency.

The gist of the invention is to enable the continuous transfer of electric power to the wireless receiving units, such that no, or at least considerably reduced energy storage capacity is required for the operation of the receiving units. The frequency of the RF energizing field should be distinct from the resonance (Larmor) frequency of the MR device. In this way, interference between the energizing radiation and the nuclear magnetization is effectively avoided.

The device of the invention is characterized in that the frequency of the RF energizing field is an integer multiple of the sampling frequency. Because of this, the momentary strength of the energizing field is always the same at the respective points in time when the MR signals are sampled. Furthermore, the waveform of the RF energizing field should be selected such that the integral over each sampling period is zero (e.g. a sine wave would be appropriate). Thus, no spurious interference between the inductive power supply and the sensitive receiving electronics has to be worried about. The RF energizing field of the invention can be activated throughout the complete image acquisition period without causing any image distortions.

In usual MR systems, the bandwidth of the MR signal is variable and ranges from about 500 Hz to 1.5 MHz. The sampling frequency is prescribed accordingly by the user of the MR device depending on the individual imaging situation. In order to fulfil the requirements of the sampling theorem (Nyquist criterion), the frequency of the RF energizing field must be variable at least in a range between 2 MHz and 3 MHz in accordance with the invention. In this way, a frequency value for the RF energizing field can always be found that equals an integer multiple of the sampling frequency. It is advantageously possible to implement an automatic control of the frequency of the RF energizing field based on the variable settings of the sampling means of the MR device.

For the practical realization of the invention, the wireless receiving units each comprise a detunable resonant pick-up circuit for picking up the RF energizing field. A resonant circuit enables an optimum efficiency of the inductive feeding process. The pick-up circuit should be detunable in order to match its resonance frequency to the variable frequency of the RF energizing field (which in turn is determined by the sampling frequency as described before). The pick-up circuit may incorporate a variable capacitor (e.g. a so-called varicap) to enable automatically controlled detuning. In accordance with a preferred embodiment of the invention, the wireless receiving units as self-contained devices each comprise a control logic circuit for automatically controlling the resonance frequency of the pick-up circuit such that the energy drawn off the RF energizing field precisely matches the power demand of the respective wireless receiving unit. This has the advantage that the sampling frequency during image acquisition can be selected without restrictions, and the user of the MR device has not to take care about the operation of the wireless receiving units and their power supply at all.

The wireless receiving units of the MR device of the invention may each comprise a rechargeable battery pack or an energy storage capacitor connected to the pick-up circuit. The capacity of these energy storage means can be significantly reduced with respect to prior art devices. Nevertheless, a certain energy storage can be useful in order to assure reliable function even in the case of a temporarily increased power demand of the receiving units.

The invention not only relates to a device but also to a method for magnetic resonance imaging of at least a portion of a body placed in an examination zone of an MR device, the method comprising the following steps: Exciting nuclear magnetization within the body by means of an MR imaging sequence comprising RF pulses and switched magnetic field gradients; acquiring MR signals from the body by means of a plurality of wireless receiving units placed in or near the examination zone, which receiving units each comprise a receiving antenna and a transmitter for wirelessly transmitting the received MR signals to a central processing unit remote from the examination zone; sampling the received MR signals with a sampling frequency and transforming the signal samples into digital signals, continuously generating an RF energizing field within the examination zone during acquisition and sampling of the MR signals, thereby inductively supplying electric power to the wireless receiving units, wherein the frequency of the RF energizing field is selected to be an integer multiple of the sampling frequency; transmitting the digital signals to the remote central processing unit; and reconstructing an MR image from the digital signal samples.

A computer program adapted for carrying out the imaging procedure of the invention can advantageously be implemented on common computer hardware for the control of magnetic resonance scanners. The computer program can be provided on suitable data carriers, such as CD-ROM or diskette. Alternatively, it can also be downloaded by a user from an internet server.

The following drawings disclose preferred embodiments of the present invention. It should be understood, however, that the drawings are designed for the purpose of illustration only and not as a definition of the limits of the invention. In the drawings FIG. 1 shows an embodiment of a magnetic resonance scanner according to the invention, FIG. 2 shows schematically an arrangement of a plurality of receiving units and corresponding energizing means in accordance with the invention.

In FIG. 1 a magnetic resonance imaging device 1 in accordance with the present invention is shown as a block diagram. The apparatus 1 comprises a set of main magnetic coils 2 for generating a stationary and homogeneous main magnetic field and three sets of gradient coils 3, 4 and 5 for superimposing additional magnetic fields with controllable strength and having a gradient in a selected direction. Conventionally, the direction of the main magnetic field is labelled the z-direction, the two directions perpendicular thereto the x- and y-directions. The gradient coils are energized via a power supply 9. The apparatus 1 further comprises a radiation emitter 6, an antenna or coil, for emitting radio frequency (RF) pulses to a body 7 placed in the examination zone of the device 1, the radiation emitter 6 being coupled to a modulator 8 for generating and modulating the RF pulses. Also provided are receiving units 10a, 10b placed in or near the examination zone of device 1. Each of the receiving units 10a, 10b comprises a receiving antenna 11a, 11b respectively for receiving MR signals from the body 7. These receiving antennas 11a, 11b are forming a coil array for the purpose of parallel imaging. The receiving antennas 11a, 11b can for example be separate surface coils with different spatial sensitivity profiles as they are required for SENSE imaging. The received MR signals are sampled by sampling means (not depicted) integrated in the individual receiving units 10a, 10b and transformed into digital signals. The receiving units 10a, 10b are equipped with signal transmission antennas 12a, 12b for wireless radio transmission of the digital signals in a multiplexed fashion to a corresponding data processing unit 13, for example a computer equipped with a radio antenna 14, for transformation of the received digital magnetic resonance signals into an image, for example in accordance with the known SENSE technique. This image can be made visible on a visual display unit 15. The modulator 8, the emitter 6 and the power supply 9 for the gradient coils 3, 4 and 5 are controlled by a control system 16 to generate the actual imaging sequence for parallel imaging. The control system 16 is further connected to an energizing unit 17 for generating an RF energizing field radiated via an antenna 18 towards the receiving units 10a, 10b. The RF energizing field is picked up by the receiving units 10a, 10b by means of separate receiving antennas (coils) 19a, 19b. Thereby electric power is inductively supplied to the wireless receiving units 10a, 10b. In the depicted embodiment, the energizing unit 17 is controlled by the MR system 16 such that the frequency of the RF energizing field is an integer multiple of the sampling frequency in accordance with the invention. In this way, electric power can be supplied to the receiving units 10a, 10b continuously via the energizing 17 throughout the complete imaging procedure.

Figure 2:
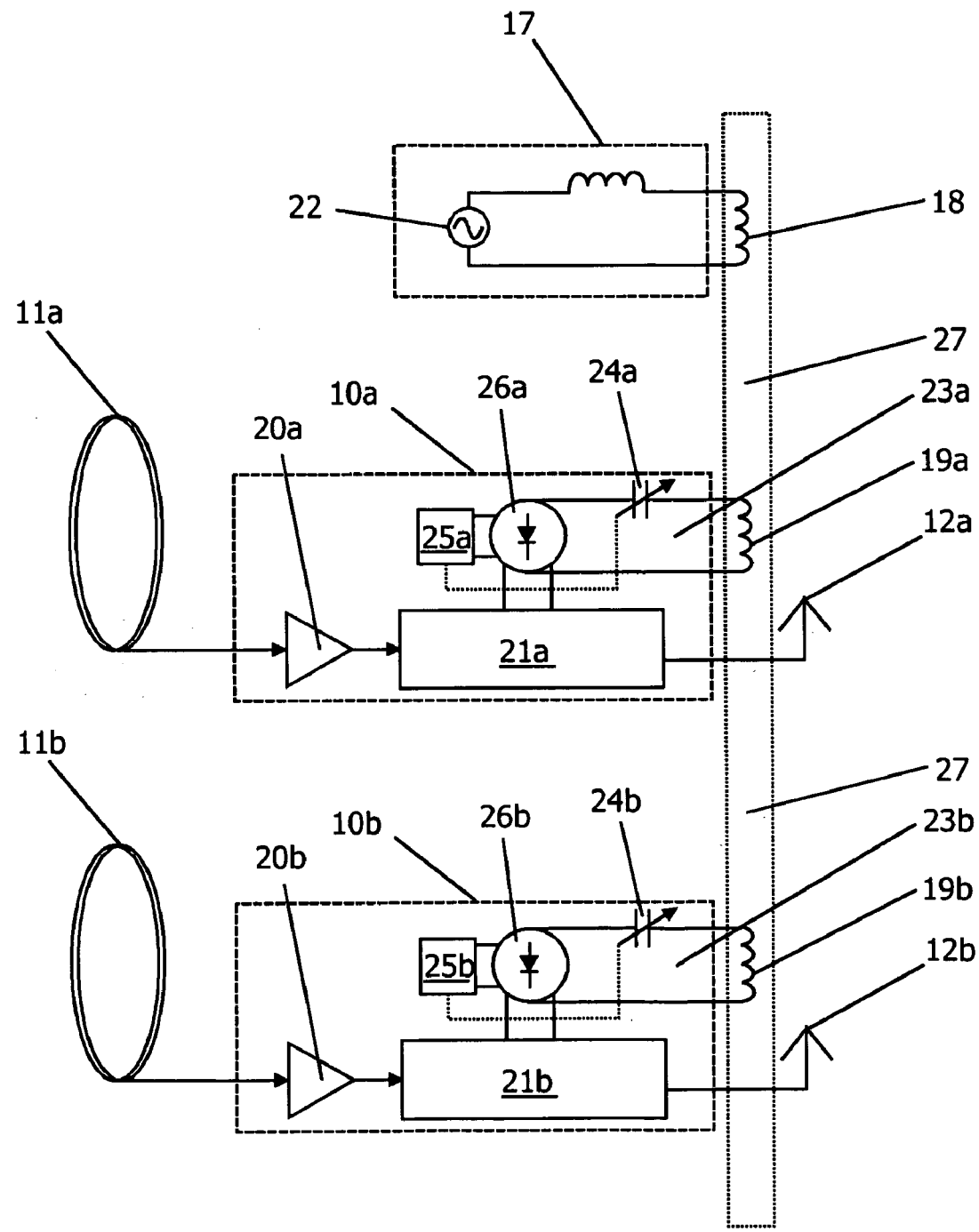

With reference to FIG. 2, an arrangement of a plurality of receiving units 10a, 10b and an energizing means 17 in accordance with the invention is shown. The receiving units 10a, 10b are equipped with receiving coils 11a, 11b for receiving MR signals from the body of an examined patient. The receiving coils 11a, 11b are connected to sensitive analog radio frequency preamplifiers 20a, 20b. The receiving units 10a, 10b further include sampling and transmitting units 21a, 21b for sampling of the received MR signals and for radio transmission of the digital signals over an wireless radio communication link of the MR device. For this purpose, each of the receiving units 10a, 10b is equipped with a radio signal transmission antenna 12a, 12b. Inductive feeding of the receiving units 10a, 10b is achieved by means of an energizing unit 17. The energizing unit 17 incorporates an AC power source 22, the frequency of which being controllable in accordance with the invention. A corresponding RF energizing field is generated by means of a coil 18. This field is picked up by coils 19a and 19b of the receiving units 10a, 10b. Coils 19a, 19b together with variable capacitors 24a, 24b form resonant circuits 23a, 23b. Provision is made for control logic circuits 25a, 25b for automatically controlling the resonance frequency of the pick-up circuits 23a, 23b in accordance with the momentary power demand of the components of the receiving units 10a, 10b. For this purpose, the control logic circuits 25a, 25b are connected to rectifiers 26a, 26b of the pick-up circuits 23a, 23b. The logic circuits 25a, 25b are thereby enabled to measure the (rectified) supply voltage induced in the pick-up circuits 23a, 23b by the RF energizing field. A closed loop control circuit for the automatic detuning of the resonant pick-up circuits 23a, 23b is established in this way. The arrangement depicted in FIG. 2 corresponds in principal to a conventional power converter. The main difference is that in conventional converters the primary side and the secondary side are closely coupled, e.g. by a transformer joke, while a large air gap 27 is present in the MR device of the invention. This leads to a comparatively weak coupling between the primary side (energizing means 17) and the secondary sides (receiving units 10a, 10b). For a practical implementation of the invention, the current generated by the AC source 22 is kept constant independent of the number of receiving units 10a, 10b present, while the pick-up circuits 23a, 23b of the self-contained receiving units are regulated automatically in accordance with their individual power demand. For maximum power transfer from the energizing unit 17 to the receiving units 10a, 10b, the pick-up circuits 23a, 23b are tuned by the control logic circuits 25a, 25b exactly to the frequency of the AC source 22. If less power is needed, the capacitors 24a, 24b are adjusted such that the pick-up circuits 23a, 23b are not exactly in resonance.

The invention claimed is:

1. MR device for magnetic resonance imaging of a body placed in an examination zone, the device comprising:
   a main magnet for generation of a stationary and substantially homogeneous main magnetic field within the examination zone;
   a plurality of wireless receiving units placed in or near the examination zone, which receiving units each comprise a receiving antenna for receiving MR signals from the body, and a transmitter for wirelessly transmitting the received MR signals to a central processing unit remote from the examination zone;
   sampling means operating at a variable sampling frequency for sampling the received MR signals and for converting them into digital signal samples; and
   energizing means generating an RF energizing field within the examination zone for inductively supplying electric power to the wireless receiving units, the frequency of the RF energizing field being an integer multiple of the sampling frequency.

2. MR device of claim 1, wherein the frequency of the RF energizing field is distinct from the resonance frequency of the MR signals.

3. MR device of claim 1, wherein the wireless receiving units each comprise a resonant pick-up circuit for picking up the RF energizing field, which pick-up circuit is detunable.

4. MR device of claim 3, wherein the pick-up circuit comprises a variable capacitor.

5. MR device of claim 3, wherein the wireless receiving units each comprise a control logic circuit for automatically controlling the resonance frequency of the pick-up circuit in accordance with the power demand of the respective wireless receiving unit.

6. MR device of claim 3, wherein the wireless receiving units each comprise a rechargeable battery pack or an energy storage capacitor connected to the pick-up circuit.

7. Method for MR imaging of at least a portion of a body placed in an examination zone of an MR device, the method comprising the following steps:

exciting nuclear magnetization within the body by means of an MR imaging sequence comprising RF pulses and switched magnetic field gradients;

acquiring MR signals from the body by means of a plurality of wireless receiving units placed in or near the examination zone, which receiving units each comprise a receiving antenna and a transmitter for wirelessly transmitting the received MR signals to a central processing unit remote from the examination zone;

sampling the received MR signals with a sampling frequency and transforming the signal samples into digital signals;

continuously generating an RF energizing field within the examination zone during acquisition and sampling of the MR signals, thereby inductively supplying electric power to the wireless receiving units, wherein the frequency of the RF energizing field is selected to be an integer multiple of the sampling frequency;

transmitting the digital signals to the remote central processing unit; and reconstructing an MR image from the digital signal samples.

8. Method of claim 7, wherein the frequency of the RF energizing field is selected to be distinct from the resonance frequency of the MR signals.

9. Method of claim 7, wherein the waveform of the RF energizing field is selected such that the integral over the sampling period is zero.

10. A computer readable medium comprising a set of instructions for use in connection with an MR device, the instructions for:

generating an MR imaging sequence comprising RF pulses and switched magnetic field gradients by means of the MR device;

prescribing and controlling the frequency of an RF energizing field for inductively supplying electric power to wireless receiving units of the MR device during acquisition and sampling of MR signals, wherein the frequency of the RF energizing field is an integer multiple of the sampling frequency;

processing sampled and digitized MR signals;

reconstructing an MR image from the digital signal samples.

* * * * *